(12) United States Patent
Elata et al.

(10) Patent No.: US 9,303,737 B2
(45) Date of Patent: Apr. 5, 2016

(54) MOTION CONVERSION MECHANISMS

(71) Applicant: Technion Research and Development Foundation Ltd., Haifa (IL)

(72) Inventors: David Elata, Haifa (IL); Arnon Hirshberg, M. P. Misgav (IL)

(73) Assignee: Technion Research And Development Foundation Ltd., Haifa (IL)

( * ) Notice: Subject to any disclaimer, the term of this patent is extended or adjusted under 35 U.S.C. 154(b) by 44 days.

(21) Appl. No.: 13/935,589

(22) Filed: Jul. 5, 2013

(65) Prior Publication Data
US 2014/0069232 A1 Mar. 13, 2014

Related U.S. Application Data

(60) Provisional application No. 61/668,247, filed on Jul. 5, 2012.

(51) Int. Cl.
*F16H 21/44* (2006.01)
*B81B 3/00* (2006.01)

(52) U.S. Cl.
CPC .............. *F16H 21/44* (2013.01); *B81B 3/0062* (2013.01); *B81B 2201/038* (2013.01); *B81B 2203/0118* (2013.01); *Y10T 74/18888* (2015.01)

(58) Field of Classification Search
CPC .............. B81B 3/0062; B81B 2201/02; B81B 2201/0228; B81B 2203/0118; F16H 21/46–21/54
USPC ........................ 74/490–490.06, 110; 248/210; 73/774–782, 862.471, 862.472, 73/862.637, 862.639, 504.15; 267/160, 267/164

See application file for complete search history.

(56) References Cited

U.S. PATENT DOCUMENTS

| | | | | |
|---|---|---|---|---|
| 5,036,715 | A * | 8/1991 | Hanson | ....................... 73/862.59 |
| 7,246,682 | B1 * | 7/2007 | Hatch | ..................... E04D 15/00 182/102 |
| 2009/0021884 | A1 * | 1/2009 | Nakamura | ..................... 361/233 |

* cited by examiner

*Primary Examiner* — David M Fenstermacher
(74) *Attorney, Agent, or Firm* — Daniel Feigelson; Fourth Dimension IP

(57) ABSTRACT

A mechanism and method for motion conversion is disclosed. This mechanism can be easily fabricated using standard bulk micromachining technology. Based on this method with appropriate design, a horizontal, in-plane motion can be converted to a vertical or angular displacement out-of-plane. This design has great advantages in micro devices, which are built from a single layer, i.e. wafer fabrication, where an in-plane force is easy to implement, such as by the use of comb drive mechanisms, but an out-of-plane motion may be hard to achieve. The mechanism comprises a pair of beams of different heights, rigidly connected together at a number of points along their length, such that application of an in-plane force to the double beam structure results in out-of-plane motion of the double beam structure at points distant from the point of application of the force.

15 Claims, 8 Drawing Sheets

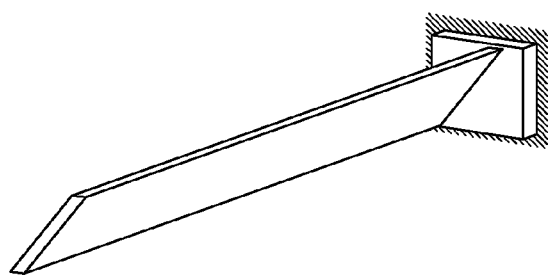
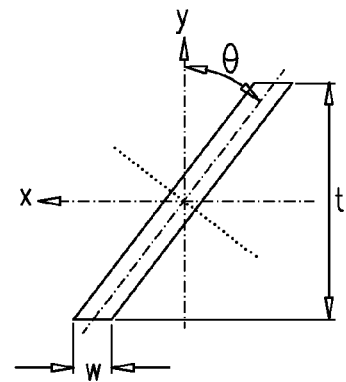
FIG. 1A
(Prior Art)
FIG. 1B
(Prior Art)
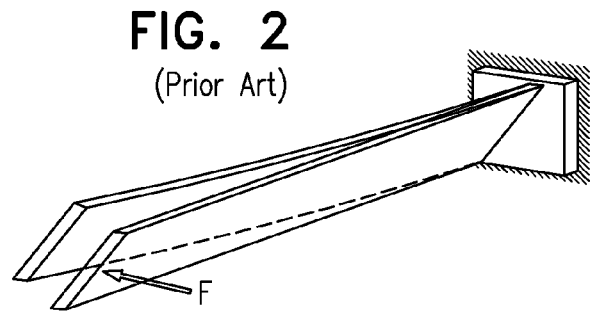
FIG. 2
(Prior Art)
FIG. 3B
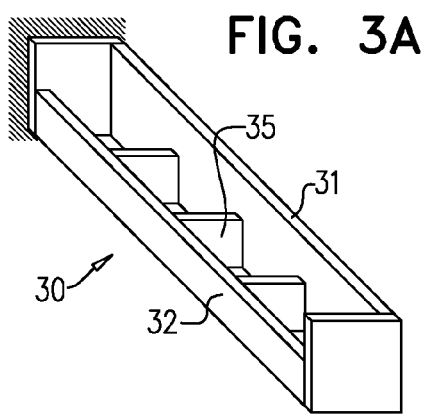
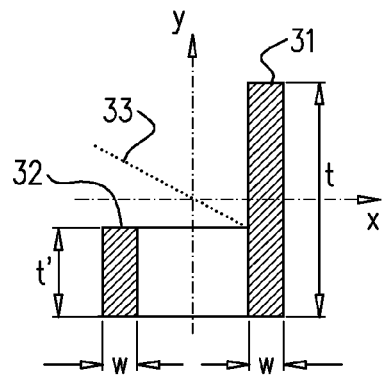
FIG. 3A

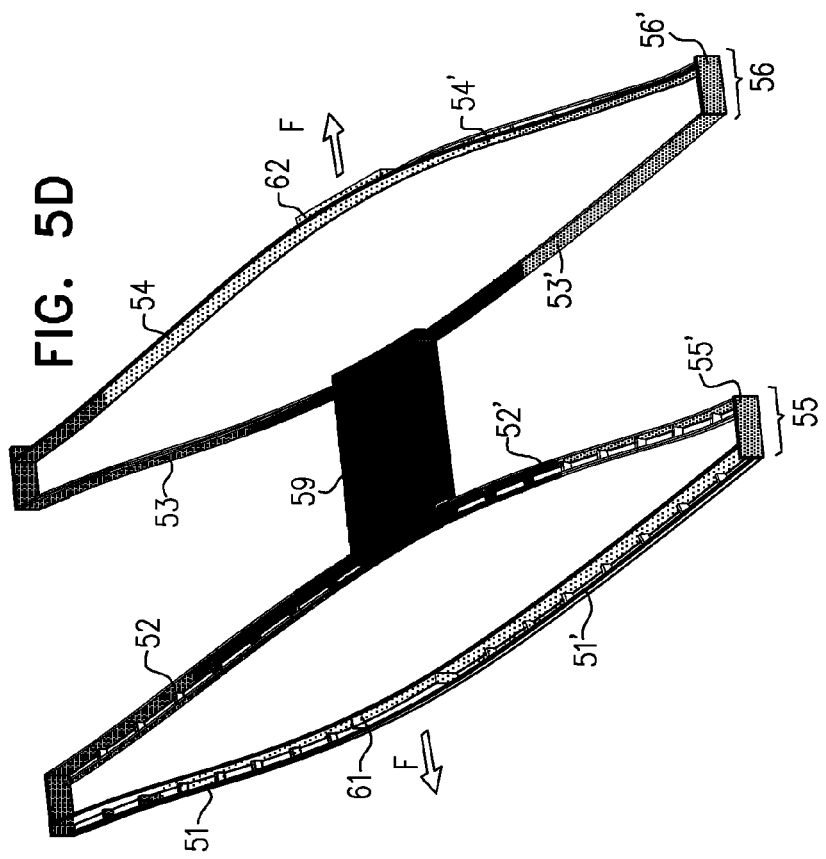
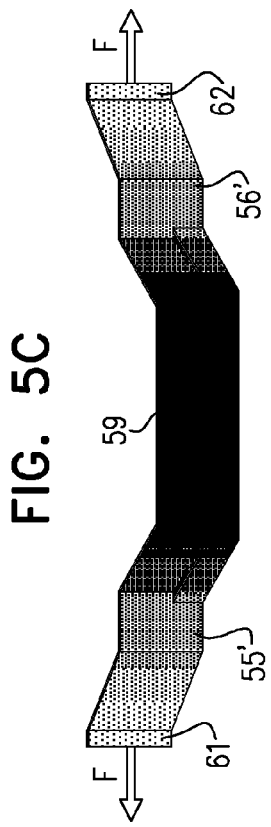

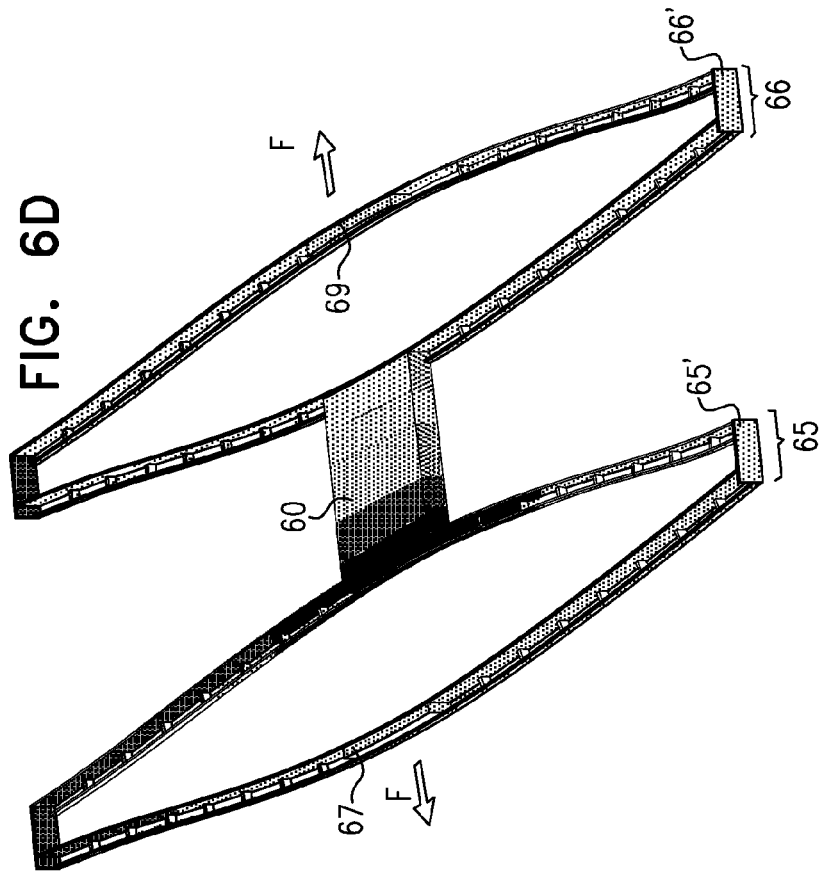

MOTION CONVERSION MECHANISMS

RELATED APPLICATIONS

The present application claims the benefit under 35 U.S.C. §119(e) of U.S. Provisional Patent Application U.S. Ser. No. 61/668,247, filed on Jul. 5, 2012, the contents of which is incorporated herein by reference, in its entirely.

FIELD OF THE INVENTION

The present invention relates to the field of micro-electromechanical system (MEMS) motion conversion mechanisms, by which a horizontally applied force can generates a vertical or an angular displacement, so that such mechanisms can convert an in-plane motion to an out-of-plane motion.

BACKGROUND OF THE INVENTION

When mechanisms are fabricated by patterning a single uniform material layer, such as in micromachining of micro devices, an out-of-plane mechanical displacement is often induced by using out-of-plane forces. This often requires hybrid complex assemblies, such as are described in the article by D. Elata, et al, "A Novel Tilting Micromirror with a Triangular Waveform Resonance Response and an Adjustable Resonance Frequency for Raster Scanning Applications," presented at the TRANSDUCERS 2007 conference, or by irreversibly deforming structural elements in the out-of-plane direction, such as is described for plastic deformation in L. Lin, et al "Microfabricated torsional actuator using self-aligned plastic deformation," presented at TRANSDUCERS 2003 conference. Fabrication of a slanted beam in a single crystal silicon has been previously demonstrated, as described in the article "Micromachining of {111} plates in [001] oriented silicon," by J. W. Berenschot, et al, published in Journal of Micromechanics and Microengineering, vol. 8, pp. 104-107, 1998. This can be achieved, for example, by anisotropic wet etching with KOH of single crystal silicon. In a single crystalline silicon wafer with a {100} orientation, anisotropic etching produces {111} surfaces which are slanted relative to the wafer surface. This process may be used to produce flexures with slanted cross-sections, such as are used in the devices described in U.S. Pat. No. 6,781,280 to Y. Ando et al, for "Slider displacement direction conversion mechanism in electrostatic actuator". One way of achieving beams with slanted cross sections is by using focused ion beam (FIB) milling as described in the paper by Y. Ando, et al, on "Design, fabrication and testing of new comb actuators realizing three-dimensional continuous motions," published in Sensors and Actuators A-Physical, vol. 97-8, pp. 579-586, 2002. However, by this method one beam is produced at a time and the process is not compatible with parallel mass fabrication of large numbers of devices on a single wafer. Another way of achieving beams with slanted cross sections is by using deep reactive ion etching (DRIE) to micromachine strips of wafers that are mounted on slanted fixtures. Such a process is described by Y. Ando, et al, in "Development of three-dimensional microstages using inclined deep-reactive ion etching," published in Journal of Micro-electromechanical Systems, vol. 16, pp. 613-621, 2007, where there is shown a dry etch DRIE machine modified such that strips of a wafer substrate can be placed diagonally to the etch direction. Similar functionality can be realized by using flexures with slanted cross-section.

Reference is now made to FIG. 1, which illustrates a prior art cantilever with slanted cross-section. The coordinate system is chosen such that the x-axis is a horizontal (in-plane) direction and the y-axis is a vertical (out-of-plane) direction. When a horizontal force is applied to the edge of the beam, the edge is displaced in both horizontal and vertical directions as shown in FIG. 2. This is because the orientation of the largest principal moment of inertia of the cross-section is tilted relative to the horizontal direction (as shown by the dotted line in FIG. 1b), thereby defining the tilt of the displacement, as is well known in the art of flexing beams. The displacement is proportional to the applied force.

A problem with all of the above described methods and devices is that when MEMS assemblies are manufactured, the simplest and lowest cost production technique is by means of a 2-D plan form, in which the desired 2-dimensional form of the device and its depth features are impressed into the depth of the substrate by means of simple etching processes, as are known in the art. The above described slanted beam structure is not easily compatible with these technologies. Methods are available for such angled etching, as mentioned hereinabove, but they require costly and time consuming additional processing steps.

There therefore exists a need for conventionally fabricated motion conversion devices for use in MEMS assemblies, which overcome at least some of the disadvantages of prior art motion conversion devices.

The disclosures of each of the publications mentioned in this section and in other sections of the specification, are hereby incorporated by reference, each in its entirety.

SUMMARY

In the present disclosure, there are described novel exemplary methods and mechanisms for conversion of motion from an essentially in-plane direction, to an out-of-plane direction. The mechanism comprises a pair of flexure beams of different heights, rigidly connected together at a number of points along their length, such that application of an in-plane force to this double beam structure at one end, results in out-of-plane motion. Using such mechanisms, a horizontal displacement can be converted to a vertical or angular displacement.

The mechanism is advantageous over prior art methods of motion conversion in that it is compatible with standard micromachining technology. This has great advantages in micro devices, which are built by single layer wafer fabrication, where an in-plane force is easy to implement, such as by the use of electrostatic comb-drive actuators, but an out-of-plane motion may be hard to achieve, or less readily and accurately controlled. The method and devices so constructed enable the linearity and accuracy of in-plane motion devices, as known in the art, to be transferred to out-of-plane motions, whether orthogonal to the plane, or at an angle thereto.

The basic double beam structure described in this disclosure can be incorporated into more complex components, such as those using folded beam configurations, to enable more complex motion patterns to be generated from the in-plane motion, involving either or both displacement and tilt of a driven platform.

There is thus provided in accordance with an exemplary implementation of the devices described in this disclosure, a motion conversion device formed on a planar substrate, the device comprising:

(i) a first beam having a cross section having a first height, formed in suspension on the substrate, (ii) a second beam having a cross section having a second height different from the first height, formed in suspension on the substrate, the second beam being formed adjacent to the first beam and with their height dimensions parallel, (iii) a plurality of rigid elements connecting the first and the second beams, and (iv) an actuator for applying a force in the plane of the planar substrate, to the connected first and second beams, wherein activation of the force at a point in the connected beams remote from a point at which the connected beams are fixed to the substrate generates a motion of the connected first and second beams at the point, in a direction other than in the plane of the planar substrate.

The force in such a motion conversion device may be adapted to be applied at one extremity of the connected first and second beams, and the aforesaid motion is generated at that extremity of the connected first and second beams. Additionally, the force may be adapted to be applied remotely from the extremities of the connected first and second beams, and the aforesaid motion is generated at the extremities of the connected first and second beams. In such devices, the planar substrate may be a MEMS substrate, and the force actuator an in-plane electrostatic actuator, such that the motion conversion device enables conversion of the motion of the electrostatic actuator to an out-of-substrate motion.

Still other example implementations involve a motion conversion assembly comprising:

(i) a first and a second folded beam structure, each of which comprises a pair of dual beam flexures, each beam flexure comprising a first and second beam having different heights, and being connected by means of a plurality of rigid connecting elements, each of the pair of dual beam flexures being connected at their extremities, and (ii) a motion output element attached between two adjacent dual beam flexures, one from each of the folded beam structures, such that the first and the second folded beam structures are joined in their central regions, such that at least one force input to at least one of the dual beam flexures not attached to the motion output element, and generally parallel to the plane containing the folded beam structures, is operative to generate motion of the motion output element in a direction other than in the plane containing the folded beam structures.

In such a motion conversion assembly, the at least one force input to at least one of the dual beam flexures may comprise two forces, each applied symmetrically to one of the dual beam flexures. Furthermore, the mutual positions of the first and second beams having different heights in the first folded beam structure may be the reverse of the mutual positions of the first and second beams having different heights in the second folded beam structure, such that the at least one force input results in a displacement of the motion output element in a direction generally perpendicular to the plane containing the folded beam structures. Alternatively, the mutual positions of the first and second beams having different heights in the first folded beam structure may be the same as the mutual positions of the first and second beams having different heights in the second folded beam structure, such that the at least one force input results in a tilt of the motion output element relative to the plane containing the folded beam structures.

Yet other implementations perform a method of producing any of the motion conversion assemblies described hereinabove, the method being surface micromachining compatible. In such methods, the substrate processing steps may comprise planar lithographic and etching processes applied in a single direction only.

Yet another implementation of the devices described in this disclosure includes a motion conversion device comprising:

(i) a first beam having a first height, (ii) a second beam having a second height different from that of the first beam, the second beam being held generally parallel to the first beam by means of a plurality of connecting elements rigidly attached to the first and the second beams, and (iii) an actuator for applying a force to the connected first and second beams, in a plane common to the first and second beams, wherein activation of the force to a point in the connected beams remote from a point at which the connected beams are fixed to a base generates a motion of the connected first and second beams at the point, in a direction other than in the plane common to the first and second beams.

BRIEF DESCRIPTION OF THE DRAWINGS

The present invention will be understood and appreciated more fully from the following detailed description, taken in conjunction with the drawings in which:

FIGS. 1A and 1B show a prior art cantilever with slanted cross-section;

FIG. 2 shows how the prior art slanted cantilever of FIG. 1 is displaced in both horizontal and vertical directions when subjected to a lateral force;

FIGS. 3A and 3B illustrate an exemplary implementation of a dual-height cantilever double beam structure for providing motion conversion, according to the present disclosure;

FIGS. 5A to 5D illustrate schematically a complex motion conversion structure including eight symmetrically arranged dual-height flexures of the types described in FIGS. 3A and 4A, incorporated into two dual-height flexures sub-assemblies, to provide linear vertical motion;

FIGS. 6A to 6D schematically illustrate a motion conversion structure similar in construction to that shown in FIGS. 5A to 5D, but with the dual-height flexures having the same orientation, such that the sub-assemblies provide tilting motion.

DETAILED DESCRIPTION

Reference is now made to FIGS. 3A and 3B, which illustrate an exemplary implementation of a dual-height cantilever double beam structure 30, which enables the generation of a vertical, out-of-plane motion from a force applied to the beam structure in an in-plane direction. FIG. 3A is an isometric view, while FIG. 3B is a cross-sectional view. The structure is significantly less complicated to fabricate than prior art structures designed to achieve this purpose, such as those described in the Background Section of this disclosure. The flexure structure 30 is constructed of two connected parallel beams with two different cross-sectional heights, a beam of greater height 31 and a beam of lesser height 32. For increased convenience and lower cost of fabrication, the height of the taller beam, marked t in FIG. 3B, could be made equal to the thickness of the wafer in which the structure is being fabricated, such that it would require no height reduction, while the height of the other beam, t', is recessed by means of an etching or micro-machining process. The two beams are coupled at both ends and at a number of locations along their length, by means of interconnecting elements 35, such as tie-bars, rigidly coupled to the two beams, which are thereby held at a fixed and close distance from each other. The beams should be connected at or close to their ends, and at least one additional interconnecting element disposed remotely from either end of the beam structure is essential to generate the motion conversion.

The relationship between the horizontal and the vertical motion is determined by the physical characteristics of the two beams, namely their elastic constants and their physical cross-sectional dimensions. By selection of these parameters, the ratio of the desired motion conversion can be determined. Though the beams are shown in FIG. 3B as having the same width, W, it is to be understood that this is not essential and that different widths may be used according to the bending characteristics desired.

Figure 4A:
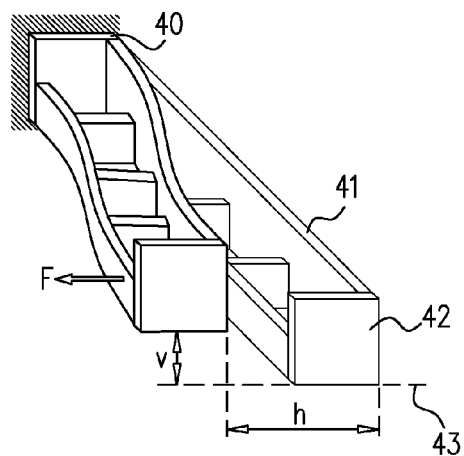
FIGS. 4A to 4C illustrate how the dual-height double beam structure of FIG. 3A bends on application of a force in a lateral direction.

Reference is now made to FIG. 4A, which is an isometric view of how the double beam structures of FIGS. 3A and 3B flexes. The structure is fixed at one of its ends 40, and its rest position is indicated by the structure in a straight configuration in position 41, with the other end of the structure 42 located on a plane indicated by the line 43 of the base plane, with the structure resting on that plane. Application of a horizontal force F to the flexure end 42 causes the flexure end to undergo a lateral (horizontal in the drawing of FIG. 4A) displacement in the direction of the force, as expected, but also to move out of the plane 43 (vertically in the drawing of FIG. 4A). The horizontal movement is marked by the distance h, and the vertical movement by the distance v. This form of flexure motion occurs because the geometry of the cross section of the two-beam structure is asymmetric, and the orientation of the largest principal moment of inertia of the cross-section is tilted relative to the horizontal direction, as shown by the dotted line 33 in FIG. 3B.

Figure 4B:
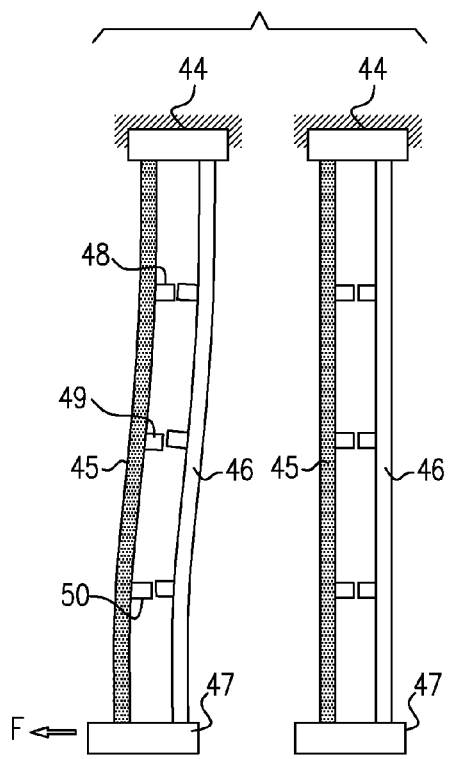
Figure 4C:
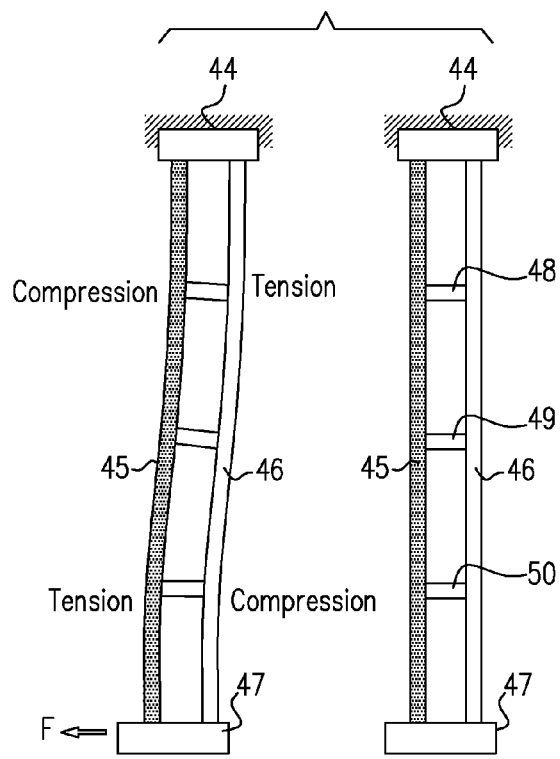

In order to explain phenomenologically how this out-of-plane motion form is generated, reference is now made to FIGS. 4B and 4C, which shows schematically a plan view of a pair of beams 45, 46, of the type used in the double beam structure of FIG. 3. In the example used in FIGS. 4B-4C, beam 45, lightly shaded in the drawings, is lower in height than beam 46. The beams are attached together at both of their ends 44, 47, and also have, in the example shown, three connecting elements 48, 49, 50 at three preferably equally spaced points. End 44 is clamped in position. In order to illustrate the mechanical processes occurring as the beams are flexed, each of the connecting elements 48, 49, 50, is shown divided into two halves. This facilitates understanding how these connecting elements affect the mechanical response of the structure when the connecting elements are intact, as will be shown in FIG. 4C. In both FIGS. 4B and 4C, there is shown the beam assembly at rest on the right hand side of each drawing, and the beam under flexure on the left hand side of each drawing.

Since the beams are both attached at right angles to their end connecting members 44, 47, as the free end connection member 47 is moved laterally, for instance, by means of the applied force F, to the left in the drawing of FIG. 4B, each of the beams acquires an S-shaped deformation. As a result of this deformation, the various points of beam 46, as designated by markers 48, 49, 50 move in the upward direction in the implementation shown in FIG. 4B, while the various points of beam 45 as designated by markers 48, 49, 50, move in a downward direction in the implementation shown in FIG. 4B. However, the connecting elements 48, 49, 50 are not divided, as shown just for illustrative purposes in FIG. 4B, but are in real life, single elements, such that when the two half elements are pulled together to their true, single element position, compressions and tensions are generated within the different lengths of the beams, as indicated in FIG. 4C. The top half of the length of the lower height beam 45, is put under compression by the "recombination" of the markers, since that part of the beam 45 moves towards the fixed end 44. Likewise, the bottom half of the length of the lower height beam 45, is put under tension by the "recombination" of the markers, since that part of the beam 45 moves away from the free end connection member 47. The opposite situation exists in the taller beam 46, with tension in the upper part of its length, and compression in the lower part of its length.

This combination of internal stresses within the connected beams has the following result. In the upper part of the drawing of the now connected beam structure, the combination of compression on the shorter height beam 45, and tension on the taller beam 46, generates a moment on the combined beam structure, causing it to bend out of the plane of the drawing. Likewise in the lower part of the now connected beam structure, the combination of tension on the lower height beam 45 and compression on the taller beam 46 generates a motion on the combined beam structure, causing it too to bend out of the plane of the drawing. Since the beams are rigidly connected at their ends, the structure cannot rotate but maintains a parallel orientation but bends in a plane perpendicular to the plane of the lateral force F, i.e. out of the plane of the drawing.

It is possible to double the motion conversion effect by incorporating flexures with dual-height beams of the type described hereinabove into a "folded-beam" structure. The combination of several "folded beam", dual-height flexures with different orientation can be used to create systems with customized motion conversions in a number of different directions, all actuated from in-plane motion or motions.

Reference is now made to FIGS. 5A to 5D, which illustrate schematically a more complex motion conversion structure 58 incorporating a central motion platform 59 attached to 8 symmetrically arranged flexures of the dual height types described hereinabove. The 8 flexures are arranged in two dual-height flexure subassemblies 55, 56. Each of the two subassemblies 55, 56 is made up of two connected pairs of the double beam structures shown in FIG. 4A. The connected pairs of each subassembly are connected at both of their ends to be in parallel. The ends are unattached to any base or substrate and are free to move spatially, particularly in the direction perpendicular to the plane of the parallel beam structures. The actuating forces are applied at the central connection region of the outer connected pairs of double beam structures of each subassembly, and in the plane of the double beam structures. The output motion is obtained at an output platform 59 attached to the central connection region of the inner connected pair of double beam structures of the subassemblies, and essentially in a direction perpendicular to the plane of the parallel beams.

Figure 5B:
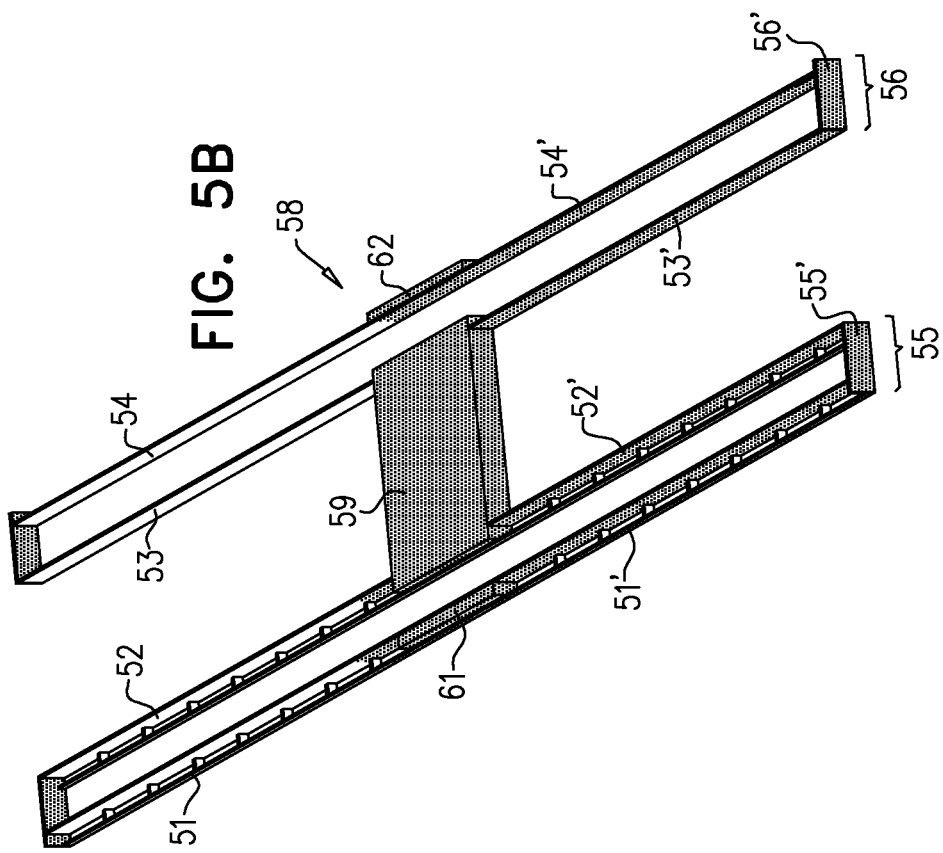
Figure 5A:
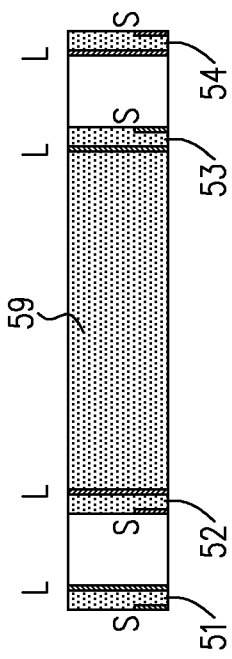
Figure 6B:
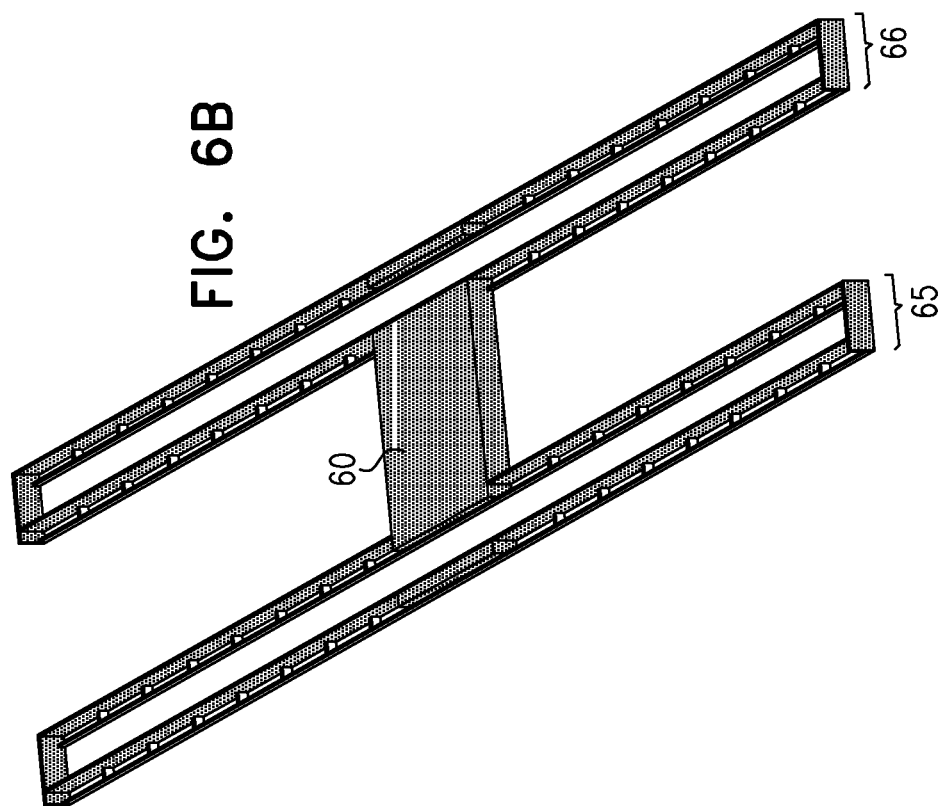
Figure 6A:
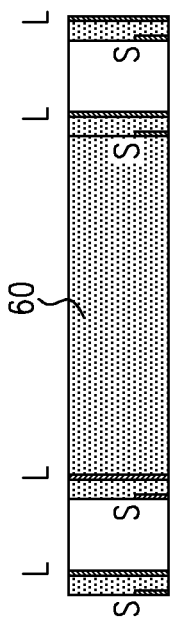

FIG. 5A is an end view of the structure, showing the 8 dual height beam structures, 51 to 54, and 51' to 54' (not marked), each having a short beam S and a longer beam L cross connected as described in FIGS. 3A, 3B hereinabove, and with the output platform between them. In FIG. 5B, there is shown how two pairs of dual height beam structures 51, 51', 52, 52' are connected into a first subassembly 55, while the other two pairs of dual height beam structures 53, 53', 54, 54' are connected into a second subassembly 56. The platform 59 is attached between the central regions of the innermost dual height beam structures 52, 52' and 53, 53'. The two subassemblies are arranged to be of opposite symmetry laterally, such that when symmetric horizontal forces F are applied to the actuation points 61, 62, at the connection points of the outer elements 51, 51' and 54, 54' of the two subassemblies, the platform 59 rises or descends in a vertical direction, depending on whether the forces F are applied in a tension-wise or a compressive manner. This is illustrated schematically in FIGS. 5C and 5D, where FIG. 5C shows a schematic end view reprojected as an isometric view of the motion conversion structure, in order to better illustrate the motion of the various parts of the device relative to the rest plane, while FIG. 5D shows a true isometric view thereof. The vertical motion of the platform 59 out of the plane of application of the forces F becomes clear from FIG. 5C, where the density of the shading of the parts indicates the displacement height from the initial rest plane, with the densest shading representing the greatest displacement above the zero plane. The vertical displacement of the end connection sections 55' and 56' of each subassembly is seen to be intermediate that of the force application points 61, 62, and the output motion platform 59.

The relationship between the directions of the applied forces and the direction of motion of the platform depends on the mutual lateral positions of the short and long beams S, L. In the example shown in FIGS. 5A-5D, outward (tensional) application of the forces F results in the platform moving in an upward direction. Reversal of the positions of the long and short beams in all of the dual height beam structures would result in oppositely directed motion.

The in-plane forces F may readily be generated by any of the commonly used methods for achieving planar motion, one such convenient and readily controllable method being by means of an electrostatic actuator, such as an electrostatic comb drive, as is known in the art, which can provide very linear and accurately controllable motion, and can be fabricated by simple and well-tried planar processes.

Reference is now made to FIGS. 6A to 6D, which schematically illustrate a motion conversion structure 68, similar in construction to that shown in FIGS. 5A to 5D, but in this case, all of the dual-height flexures have the same orientation. As a result, application of symmetric horizontal forces F to the suspensions, results in tilt of the platform 60, since the points of attachment of the platform to each of the subassembly configurations 65, 66, move in opposite directions since all of the dual-height flexures have the same lateral orientation, while the forces are applied in opposite directions.

In the above described implementations of FIG. 5A-5D and FIG. 6A-6D, exemplary structures are shown which generate respectively vertical out-of-plane displacement, and angular motion, each thus providing motion in a single degree of freedom. However, it is to be understood that it is possible to achieve more complex motion conversion mechanisms by different arrangements of dual-height flexures, such that multiple degree of freedom motion systems can be built, all actuated by lateral motions within a single plane Reference is now made to FIGS. 7A to 7G, which illustrate schematically one exemplary method of how devices incorporating double height beam structures of the type described in this disclosure, can be readily fabricated on a planar substrate, such as a silicon, or an SOI wafer.

Figure 7A:
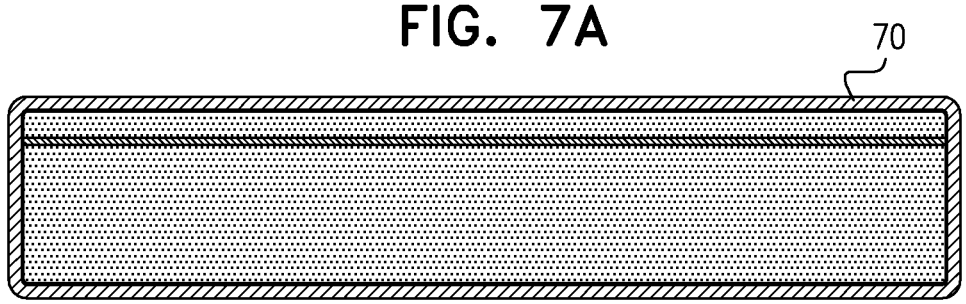
FIGS. 7A to 7G illustrate schematically one exemplary method of how the devices of FIGS. 3A to 6D can be readily fabricated on a planar SOI wafer substrate.

In FIG. 7A, there is shown an SOI wafer with a 1 μm thermally generated $SiO_2$ layer hard mask 70 applied over the entire surface area of the substrate.

Figure 7B:
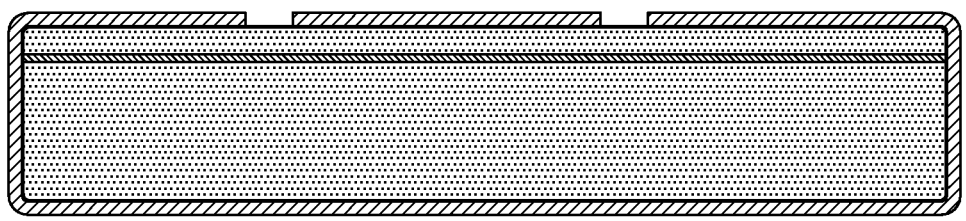

In FIG. 7B, the hard mask has been patterned, and etched on the front surface, to expose the silicon at the recessed areas. The windows in the example shown are 10 μm wide, which is wider than the 5 μm beam width desired, since it is impossible to align the successive masks so accurately that a 5 μm initial window could be used.

Figure 7C:
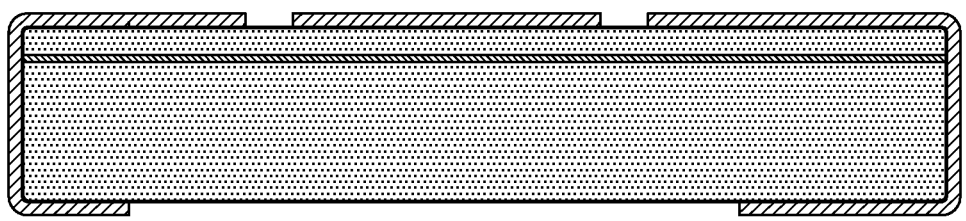

In FIG. 7C, the hard mask has been patterned and etched also on the rear surface, to generate a window for the ultimate etching away of the volume of the device from the rear.

Figure 7D:
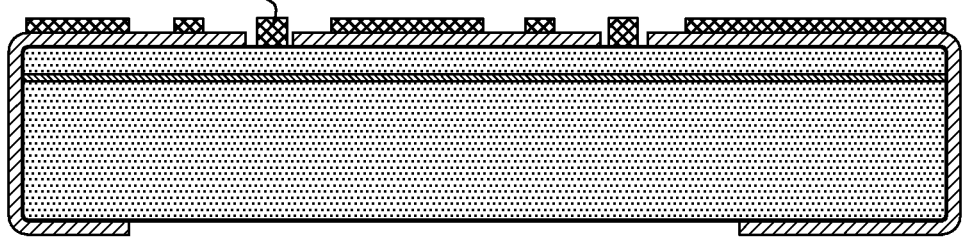

In FIG. 7D, the entire final front side pattern is generated for the hard mask and photoresist soft mask etch. The photoresist soft mask 75 is applied over those areas where it is desired to protect the hard mask from being etched away in step 7E.

Figure 7E:
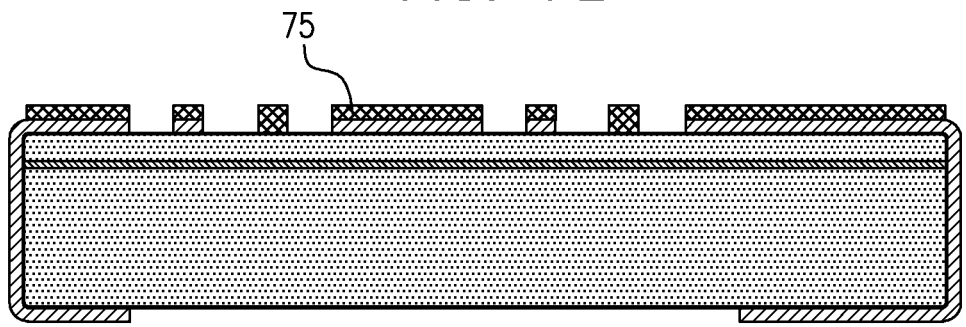

In FIG. 7E, the hard mask layer has been etched away in those regions unprotected by the PR soft mask, where it is desired to etch away the silicon layer in the following step 7F.

Figure 7F:
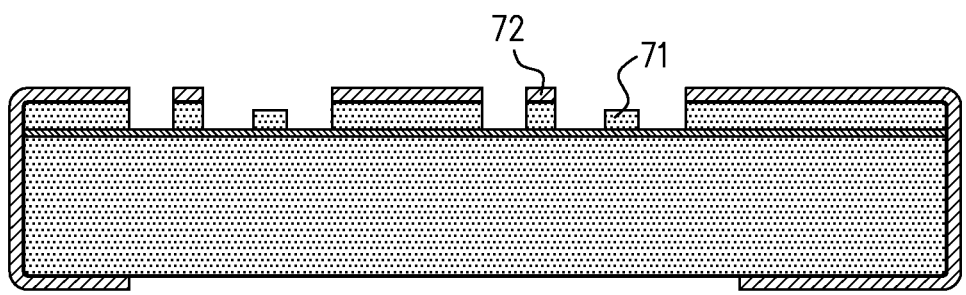

In FIG. 7F, the photoresist is first stripped off, and the front side undergoes Deep Reactive Ion Etching (DRIE) to remove the silicon to the desired depth, thereby etching away the height of the region 71 which is intended to be the low height beam of the double-beam structure. The full height beam 72 is left at its original height, since it is still protected by the hard mask.

Figure 7G:
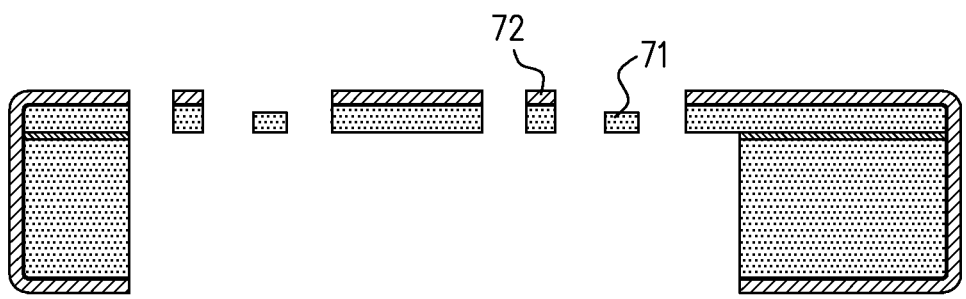

In FIG. 7G, back side DRIE is performed in order to etch out the spaces beneath the beam structures and thus to release them into free space, thereby completing the fabrication process. As an alternative, it is possible to wet etch from the back surface to generate a cavity beneath the beams, thereby releasing them.

It is to be emphasized though, that the process described here is only one by which the devices could be fabricated, and the invention is not intended to be limited to use of this particular process.

It is appreciated by persons skilled in the art that the present invention is not limited by what has been particularly shown and described hereinabove. Rather the scope of the present invention includes both combinations and subcombinations of various features described hereinabove as well as variations and modifications thereto which would occur to a person of skill in the art upon reading the above description and which are not in the prior art.

We claim:

1. A motion conversion device formed on a MEMS planar substrate, said device comprising:
   a first beam formed in suspension on said substrate, and having a first height in a direction perpendicular to the longest dimension of said first beam;
   a second beam formed in suspension on said substrate, and having a second height in a direction perpendicular to the longest dimension of said second beam, said second beam being formed adjacent to said first beam and with their height dimensions parallel;
   a plurality of rigid elements connecting said first and said second beams to form a connected-beam element; and
   an in-plane electrostatic actuator for applying an in-plane force to said connected-beam element,
   wherein activation of said in-plane force at a first point in said connected-beam element remote from a second point at which said connected-beam element is fixed to said substrate generates a motion of said connected-beam element at said first point, in an out-of-plane direction, such that said motion conversion device enables conversion of the motion of said electrostatic actuator to an out-of-plane motion.

2. A motion conversion device according to claim 1, wherein one extremity of said connected-beam element is adapted to have said in plane force applied thereto, whereby said motion is generated at said extremity of said connected-beam element.

3. A motion conversion device according to claim 1, wherein a location remote from the extremities of said connected-beam element is adapted to have said in-plane force applied thereto, whereby said motion is generated at the extremities of said connected-beam element.

4. A method of producing the motion conversion device of claim 1, said method being surface micromachining compatible.

5. A method of producing the motion conversion device of claim 1, wherein the substrate processing steps of said method comprise planar lithographic and etching processes applied in a single direction only.

6. A motion conversion assembly comprising:
   a first and a second folded beam structure, each of which comprises a pair of dual beam flexures, each beam flexure comprising a first and second beam having different heights, and being connected by means of a plurality of rigid connecting elements, each of said pair of dual beam flexures being connected at their extremities; and
   a motion output element attached between two adjacent dual beam flexures, one from each of said folded beam structures, such that said first and said second folded beam structures are joined in their central regions,
   such that at least one force input to at least one of said dual beam flexures not attached to said motion output element, and generally parallel to the plane containing said folded beam structures, is operative to generate motion of said motion output element in a direction other than in said plane containing said folded beam structures.

7. A motion conversion assembly according to claim 6, wherein said at least one force input to at least one of said dual beam flexures comprises two forces, each applied symmetrically to one of said dual beam flexures.

8. A motion conversion assembly according to claim 6, wherein the mutual positions of said first and second beams having different heights in said first folded beam structure are the reverse of the mutual positions of said first and second beams having different heights in said second folded beam structure, such that said at least one force input results in a displacement of said motion output element in a direction generally perpendicular to said plane containing said folded beam structures.

9. A motion conversion assembly according to claim 6, wherein the mutual positions of said first and second beams having different heights in said first folded beam structure are the same as the mutual positions of said first and second beams having different heights in said second folded beam structure, such that said at least one force input results in a tilt of said motion output element relative to said plane containing said folded beam structures.

10. A method of producing the motion conversion assemblies according to claim 6, said method being surface micromachining compatible.

11. A method of producing the motion conversion assemblies according to claim 6, wherein any substrate processing steps of said method comprise planar lithographic and etching processes only.

12. A method of producing the motion conversion assemblies according to claim 8, said method being surface micromachining compatible.

13. A method of producing the motion conversion assemblies according to claim 8, wherein any substrate processing steps of said method comprise planar lithographic and etching processes only.

14. A method of producing the motion conversion assemblies according to claim 9, said method being surface micromachining compatible.

15. A method of producing the motion conversion assemblies according to claim 9, wherein any substrate processing steps of said method comprise planar lithographic and etching processes only.

\* \* \* \* \*